US010343945B2

(12) United States Patent
Mimoun et al.

(10) Patent No.: US 10,343,945 B2
(45) Date of Patent: Jul. 9, 2019

(54) PROCESS FOR OBTAINING A SUBSTRATE

(71) Applicant: SAINT-GOBAIN GLASS FRANCE, Courbevoie (FR)

(72) Inventors: Emmanuel Mimoun, Paris (FR); Brice Dubost, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 354 days.

(21) Appl. No.: 14/893,390

(22) PCT Filed: May 21, 2014

(86) PCT No.: PCT/FR2014/051191
§ 371 (c)(1),
(2) Date: Nov. 23, 2015

(87) PCT Pub. No.: WO2014/188125
PCT Pub. Date: Nov. 27, 2014

(65) Prior Publication Data
US 2016/0122227 A1    May 5, 2016

(30) Foreign Application Priority Data

May 24, 2013   (FR) ..................... 13 54729

(51) Int. Cl.
*C03B 27/012*   (2006.01)
*B23K 26/53*    (2014.01)
(Continued)

(52) U.S. Cl.
CPC ........ *C03B 27/012* (2013.01); *B23K 26/0006* (2013.01); *B23K 26/0624* (2015.10);
(Continued)

(58) Field of Classification Search
CPC .... B23K 26/53; B23K 26/55; B23K 26/0006; B23K 26/0066; B23K 26/0624; B23K 26/0626; B23K 26/008; C03B 27/012
See application file for complete search history.

(56) References Cited

U.S. PATENT DOCUMENTS 4,309,225 A * 1/1982 Fan ..................... C30B 1/023
                                                    438/72
6,284,437 B1 * 9/2001 Kashyap ............ G02B 6/02085
                                                    355/48
(Continued)

FOREIGN PATENT DOCUMENTS

DE    102007052782 A1 *  5/2009
EP      1 705 522 A2     9/2006
(Continued)

OTHER PUBLICATIONS

Machine translation of Japan Patent document No. 2007-324519 (Year: 2019).*

(Continued)

*Primary Examiner* — Geoffrey S Evans
(74) *Attorney, Agent, or Firm* — Pillsbury Winthrop Shaw Pittman LLP

(57) ABSTRACT

In a process for obtaining a transparent substrate including a refractive index modulation pattern, a transparent substrate is irradiated with a laser radiation focused on the substrate in the form of at least one laser line, where the substrate at least partially absorbs the laser radiation, a relative movement is generated between the substrate and the laser line focused on the substrate, in a direction (X) transverse to the longitudinal direction (Y) of the laser line, and, in the course of this relative movement, the power of the laser line is temporally modulated as a function of the speed of the
(Continued)

relative movement and as a function of the dimensions of the pattern in the direction (X) of the relative movement.

20 Claims, 3 Drawing Sheets

(51) Int. Cl.
    *B23K 26/06*           (2014.01)
    *B23K 26/08*           (2014.01)
    *B23K 26/00*           (2014.01)
    *B23K 26/0622*        (2014.01)
    *C03C 23/00*          (2006.01)
    *B23K 26/352*         (2014.01)
    *G03F 7/00*            (2006.01)
    *B23K 103/00*         (2006.01)

(52) U.S. Cl.
    CPC .......... *B23K 26/0626* (2013.01); *B23K 26/08* (2013.01); *B23K 26/352* (2015.10); *C03C 23/0025* (2013.01); *B23K 2103/50* (2018.08); *G03F 7/001* (2013.01)

(56) References Cited

U.S. PATENT DOCUMENTS

| | | | | |
|---|---|---|---|---|
| 6,555,447 B2 * | 4/2003 | Weishauss | ............. | B28D 1/221 257/E21.599 |
| 6,977,137 B2 * | 12/2005 | Borrelli | ............... | C03C 23/0025 430/321 |
| 6,992,026 B2 * | 1/2006 | Fukuyo | .................. | B23K 26/03 438/797 |
| 7,411,151 B2 * | 8/2008 | Sugioka | ............. | C03C 23/0025 219/121.73 |
| 2002/0041323 A1 * | 4/2002 | Hayashi | ................ | B41M 5/262 347/224 |
| 2004/0002199 A1 * | 1/2004 | Fukuyo | ............. | B23K 26/0057 438/460 |
| 2004/0071420 A1 * | 4/2004 | Sezerman | ........... | C03C 23/0025 385/123 |
| 2004/0180773 A1 * | 9/2004 | Schreder | .................. | C03C 4/04 501/7 |
| 2005/0070035 A1 * | 3/2005 | Yazaki | ................. | B23K 26/032 438/22 |
| 2006/0039419 A1 * | 2/2006 | Deshi | ................... | H01C 17/242 372/9 |
| 2007/0041410 A1 * | 2/2007 | Hongo | ................ | H01L 21/2026 372/24 |
| 2007/0091977 A1 * | 4/2007 | Sohn | .................. | G02B 6/02147 372/109 |
| 2007/0280314 A1 * | 12/2007 | Keh | ..................... | H01S 5/06808 372/38.02 |
| 2009/0095962 A1 * | 4/2009 | Matsunobu | .......... | B23K 26/032 257/88 |
| 2009/0289382 A1 * | 11/2009 | Lijana | .............. | B29D 11/00125 264/1.37 |
| 2009/0304331 A1 * | 12/2009 | Herman | ............. | G02B 6/02128 385/37 |
| 2010/0118899 A1 * | 5/2010 | Peng | .................. | H01S 3/06754 372/25 |
| 2010/0183040 A1 * | 7/2010 | Ishizu | ................. | H01S 3/06754 372/25 |
| 2010/0210442 A1 | 8/2010 | Abramov et al. | | |
| 2011/0097550 A1 * | 4/2011 | Matusovsky | ...... | B23K 26/0738 428/167 |
| 2011/0240617 A1 * | 10/2011 | Xu | ......................... | B23K 26/00 219/121.72 |
| 2011/0252834 A1 * | 10/2011 | Ono | .................... | C03C 23/0025 65/111 |
| 2013/0112667 A1 * | 5/2013 | Holmgren | ............. | H01L 21/268 219/121.6 |
| 2013/0188661 A1 * | 7/2013 | Wilk | ......................... | H01S 3/10 372/25 |
| 2016/0168679 A1 * | 6/2016 | Nadaud | ................ | B23K 26/352 148/525 |

FOREIGN PATENT DOCUMENTS

| | | | | |
|---|---|---|---|---|
| EP | 2 065 120 A1 | | 6/2009 | |
| EP | 2065120 A1 | * | 6/2009 | |
| GB | 1 523 548 A | | 9/1978 | |
| JP | 2000-147228 A | * | 5/2000 | |
| JP | 2007324519 A | * | 12/2007 | |
| WO | WO-9833096 A1 | * | 7/1998 | ............... G03F 1/76 |
| WO | WO 2007/063458 A1 | | 6/2007 | |

OTHER PUBLICATIONS

International Search Report as issued in International Patent Application No. PCT/FR2014/051191, dated Aug. 5, 2014.

* cited by examiner

PROCESS FOR OBTAINING A SUBSTRATE

This application is the U.S. National Stage of PCT/FR2014/051191, filed May 21, 2014, which in turn claims priority to French patent application No. 1354729 May 24, 2013. The content of these applications are incorporated herein by reference in their entireties.

The present invention relates to a process for obtaining a transparent substrate having modulated optical properties. The invention also relates to an apparatus for treating a transparent substrate in order to provide it with modulated optical properties, and to a transparent substrate having modulated optical properties.

It is known to modulate the optical and/or aesthetic properties of a substrate by creating, on its surface, a texture or a pattern. To create a surface texture, conventional techniques especially include engraving, sandblasting or acid etching. To create a pattern, conventional techniques especially include screen printing or lithography. However, these techniques are either localized techniques, which are difficult to implement with large substrates and which cause a relatively low production rate, or are global techniques, which do not have an optimal resolution. Certain of these techniques, in particular acid etching and lithography, also carry risks due to the chemicals employed, which complicates their use on the industrial scale.

With a view to providing a substrate with particular optical and/or aesthetic properties, it is also known to modulate spatially the refractive index of the substrate. Via such refractive index modulation, it is in particular possible to adjust the light-scattering properties of the substrate, especially for light-extraction purposes, for example for OLEDs (organic light-emitting diodes), or for light-concentrating purposes, for example for solar modules. By modulating the refractive index of the substrate, it is also possible to adjust its light-diffracting properties, especially for the purposes of redirecting light. It is particularly sought to redirect light in applications that use natural light to provide illumination, in order to better distribute the natural light and improve visual comfort. The creation of a modulated refractive index pattern, on the surface or in the volume of a substrate, may also allow the visual appearance of the substrate to be modified for aesthetic purposes.

One conventional technique allowing a modulated refractive index pattern to be created in a mineral glass substrate is ion exchange. With this technique, the composition of the glass matrix of the substrate is modified locally, by ion exchange between at least one element contained in the glass and at least one element provided by a medium brought into contact with the glass. Sodium atoms contained in the glass may especially be exchanged with silver atoms provided by a silver salt placed in contact with the glass. This ion exchange, which is carried out by migration under electric field, allows an alternation of zones of controlled shape to be created in the thickness of the glass, where the refractive index changes from one zone to another, without modifying the initial relief of the surface of the glass. However, ion exchange has the drawback of being a slow and expensive process that involves multiple steps. In addition, the depth capable of being reached by the ions inside the substrate is limited.

It is these drawbacks that the invention is more particularly intended to remedy by providing a process for obtaining a transparent substrate having modulated optical properties, which process is both economical, simple and rapid, allowing high production rates to be achieved, and guarantees a high resolution level for the modulation of the optical properties of the substrate, this process being applicable even to large substrates and furthermore being particularly flexible so as to allow, on a production line, rapid changes to be made to the spatial structure of the optical properties for a given substrate or from one substrate to another.

For this purpose, one subject of the invention is a process for obtaining a transparent substrate having modulated optical properties, comprising a refractive index modulation pattern, a transparent substrate is irradiated by means of a laser radiation focused on the substrate in the form of at least one laser line, where the substrate at least partially absorbs the laser radiation, and in that a relative movement is generated between the substrate and the laser line focused on the substrate, in a direction transverse to the longitudinal direction of the laser line, and in that, in the course of this relative movement, the power of the laser line is temporally modulated as a function of the speed of the relative movement and as a function of the dimensions of the pattern in the direction of the relative movement.

In the context of the invention, a "laser line" is a laser beam focused in the form of a line having a greater longitudinal dimension than its transverse dimension, which is generated by one or several laser sources and of which all the points, in the longitudinal direction of the line, are illuminated simultaneously by the laser source(s). Thus, the laser line is obtained by irradiation at the same time of the entire surface of the line by the laser source(s).

In the context of the invention, a direction is transverse to another direction when it forms a nonzero angle with this other direction. In addition, in the context of the invention, a substrate is transparent when it lets light pass through it at least partially.

The substrate to which the process according to the invention is applied must be at least partially absorbent at the wavelength of the laser radiation, in particular have an absorption of at least 1%/mm, preferably of at least 10%/mm at this wavelength.

In the context of the invention, the substrate to which the process is applied may be a bare substrate, but also a coated substrate, i.e. a substrate comprising a coating on at least one of its faces. Of course, even in the case of a coated substrate, the refractive index modulation pattern created using the process of the invention is a modulation pattern of the refractive index of the substrate itself. However, it is not excluded that the or each coating may also be affected by the laser treatment, but in this case it will necessarily be in addition to the substrate. Cases in which only the coatings of the substrate, and not the substrate itself, are treated by the laser radiation are not included in the scope of the present invention. When the substrate is coated, the or each coating must let the laser radiation pass toward the substrate, and therefore must not be too reflective or absorbent at the wavelength of the laser radiation.

The inventors have observed that, when a transparent substrate is irradiated with a laser beam, the structure of the substrate locally undergoes a permanent modification of thermal origin, which is similar to a thermal tempering effect in the case of a mineral glass substrate, thereby generating locally a change in the refractive index of the substrate. The inventors have made use of this effect to form a refractive index modulation pattern on the surface or in the interior of a substrate. In practice, this pattern is obtained by focusing, on the substrate, at least one laser line having a suitable intensity in the focal plane, and by modulating, in time, the power of this laser line while the substrate and the laser line are moved relative to each other. As the power of the laser line changes with time, the refractive index of the substrate is spatially modulated in the course of the relative movement.

The process according to the invention allows any type of refractive index modulation pattern to be created in a transparent substrate, by adjusting the temporal modulation of the power of the laser line as a function of the speed of the relative movement between the substrate and the laser line and as a function of the spatial structure of the desired pattern. Advantageously, this process is applicable to substrates of dimensions of any size, including substrates of large dimensions, since the length of the laser line may simply be adjusted to correspond to the size of the desired pattern. The temporal modulation of the power of the laser line may be particularly responsive, thereby allowing both high resolution levels and high production rates to be achieved. Thanks to the invention, it is possible to quickly obtain a refractive index modulation pattern, even for large sizes of substrates, which is not the case by scanning with a point laser beam. Furthermore, because it is possible to reactively modulate the power of the laser line, the process according to the invention allows, on a production line, rapid changes to be made to the spatial modulation structure of the refractive index, whether for a given substrate or from one substrate to another on the line.

The substrate may be a substrate made of mineral glass, especially chosen from an oxide glass, halogenide glass, a sulphide glass, a chalcogenide glass. The oxide glass may be a silicate, borate, sulphate, phosphate, fluorophosphate or bismuthate. The halogenide glass may be of the type $BeF_2$, $ZrF_4$, $InF_3$ or Cd—Zn—Cl. The sulphide glass may be Ga—La—S. The chalcogenide glass may be Se—As. As a variant, the substrate may be a substrate made of an organic polymer, especially chosen from polycarbonate, polymethyl methacrylate, polyethylene terephthalate (PET), polyethylene naphthalate (PEN), or fluoropolymers such as ethylene tetrafluoroethylene (ETFE). The substrate may be flat or curved, and even flexible. It may also be tinted or untinted.

The substrate advantageously has at least one dimension larger than or equal to 0.5 m, especially 1 m or 2 m or even 3 m. Preferably, the surface area of the main faces of the substrate is greater than or equal to 1 $m^2$, more preferably greater than or equal to 1.4 $m^2$. In an advantageous embodiment, the treated substrate is a parallelepiped having a length of 1.3 m and a width of 1.1 m. In the case of a substrate made of glass, the thickness of the substrate generally lies between 0.5 mm and 19 mm, preferably between 0.7 mm and 9 mm, especially between 2 mm and 8 mm, or even between 4 mm and 6 mm. Substrates made of organic polymer may have much smaller thicknesses, for example comprised between 25 and 100 μm.

Preferably, the laser line is generated by modules comprising one or more laser sources and shaping and redirecting optics.

The laser sources are conventionally laser diodes, or fiber or disc lasers. Laser diodes make it possible to obtain high power densities relative to the supplied electrical power, and are small in bulk. Fiber lasers are even less bulky, and the power per unit length obtained may be even higher, however for a higher cost.

The terms "fiberized lasers" mean lasers in which the location where the laser light is generated is spatially offset with respect to the location where the laser light is supplied, the laser light being supplied by means of at least one optical fiber.

In the case of a disc laser, the laser light is generated in a resonant cavity in which is located the emitting medium which is in the form of a disc, such as a thin disc (about 0.1 mm thick) of Yb:YAG. The light thus generated is coupled into one or more optical fibers which are directed towards the treatment site.

The wavelength of the radiation beam of the or each laser line is advantageously comprised in a range extending from 100 nm to 2000 nm, especially from 100 to 350 nm or from 800 to 1000 nm. Depending on the absorption spectrum of the coating treated, it may be appropriate to use power diode lasers emitting at a wavelength chosen from 808 nm, 880 nm, 915 nm, 940 nm or 980 nm, or else excimer lasers emitting a radiation beam in the ultraviolet domain, between 100 nm and 350 nm, especially between 240 nm and 300 nm. As a variant, the wavelength of the radiation beam of the or each laser line may be comprised in a range extending from 5 μm to 15 μm, attainable using $CO_2$ lasers, for coatings absorbing such a radiation. In the case of a disc laser, the wavelength is for example 1030 nm (emission wavelength for a Yb:YAG laser). For a fiber laser, the wavelength is for example 1070 nm.

In the case of non-fiberized laser sources, the shaping and redirecting optics preferably comprise lenses and mirrors, and are used as means for positioning, homogenizing and focusing the radiation. The positioning means have the function of arranging the radiation beams emitted by the laser sources in the form of a line. They preferably comprise mirrors. The homogenizing means have the function of superposing the spatial profiles of the laser sources in order to obtain a homogeneous power per unit length all the way along the line. The homogenizing means preferably comprise lenses allowing the incident beams to be separated into secondary beams and said secondary beams to be recombined into a homogeneous line. The focusing means for focusing the radiation allow the radiation to be focused on the substrate to be treated, in the form of a line of the desired length and width. The focusing means preferably comprise a convergent lens.

In the case of fiberized laser sources, the shaping optics are preferably grouped in the form of an optical head positioned at the output of the or each optical fiber. The shaping optics in the form of said optical head preferably comprise lenses, mirrors and prisms, and are used as means for transforming, homogenizing and focusing the radiation. The transforming means comprise mirrors and/or prisms and are used to transform the circular beam, obtained at the output of the optical fiber, in an anisotropic noncircular beam in the shape of a line. To this end, the transforming means increase the quality of the beam in one of its axes (fast axis, or width axis of the laser line) and reduce the quality of the beam in the other (slow axis, or length axis of the laser line). The homogenizing means superpose the spatial profiles of the laser sources in order to obtain a homogeneous power per unit length all the way along the line. The homogenizing means preferably comprise lenses allowing the incident beams to be separated into secondary beams and said secondary beams to be recombined into a homogeneous line. Finally, the focusing means for focusing the radiation make it possible to focus the radiation at the working plane, namely on the surface or in the volume of the substrate to be treated, in the form of a line of desired width and length. The focusing means preferably comprise a focusing mirror or a convergent lens.

The shaping and redirecting optics, especially the positioning means, may be adjusted manually or using actuators allowing their position to be set remotely. These actuators, which are generally motors or piezoelectric transducers, may be manually controlled and/or set automatically. In the latter case, the actuators will preferably be connected to detectors, and to a feedback loop.

At least some of the laser modules, even all of them, are preferably arranged in a sealed and advantageously cooled, especially air-cooled, housing in order to ensure their thermal stability.

In the context of the invention, the "length" of the laser line is understood to be the largest dimension of the laser line, i.e. the size of the laser line along its longitudinal direction, and the "width" of the laser line is understood to be the dimension of the laser line in a direction perpendicular to its longitudinal direction. As is conventional in the field of lasers, the width w of the laser line corresponds to the distance, in this perpendicular direction, between the axis of the beam, where the intensity of the radiation beam is maximal, and the point where the intensity of the radiation beam is equal to $1/e^2$ times the maximum intensity. If the longitudinal axis of the laser line is denoted x, a width distribution, denoted w(x), may be defined along this axis.

According to one feature, the average width of the or each laser line is comprised between 10 μm and 1000 μm and preferably between 30 μm and 200 μm. Throughout this description, the term "average" is understood to mean arithmetic mean. Over the entire length of the laser line, the width distribution is narrow in order to ensure a uniform treatment along the laser line when the refractive index modulation pattern is created in the substrate. In this way, the difference between the largest width and the smallest width is preferably at most 10%, more preferably at most 5% or even 3%, of the value of the average width.

The length of the or each laser line is preferably at least 10 cm, preferably comprised in a range extending from 20 cm or 30 cm to 3 m. It is preferable to use a single laser line to irradiate all or part of the width of the substrate. However, it is also possible to use a plurality of laser lines arranged with their longitudinal directions parallel to one another, which may optionally be separate.

According to one feature, the laser line is such that the ratio of the length of the laser line to the average width of the laser line is greater than or equal to 10, preferably greater than or equal to 30. In a preferred embodiment, the ratio of the length of the laser line to the average width of the laser line is between 30 and 300000.

In one embodiment, the laser line is focused on the surface of the substrate. The process according to the invention then makes it possible to obtain a refractive index modulation pattern on the surface of the substrate.

In another embodiment, the laser line is focused in the volume of the substrate. The process according to the invention then makes it possible to obtain a refractive index modulation pattern in the thickness of the substrate.

According to one advantageous feature, the longitudinal direction of the laser line is substantially perpendicular to the direction of the relative movement between the substrate and the laser line. Other orientations of the laser line relative to the direction of the relative movement are however also possible and, generally, the longitudinal direction of the laser line may form any nonzero angle with the direction of the relative movement.

In one embodiment, the laser line is kept fixed and the substrate is moved translationally in a direction transverse to the longitudinal direction of the laser line. Advantageously, the substrate is moved in a substantially horizontal plane facing the laser line.

Other embodiments are also possible. For example, the substrate may be kept fixed, whereas the laser line is moved facing the substrate, especially using a movable gantry. As a variant, both the substrate and the laser line may be moved. The relative movement between the substrate and the laser line may also be a movement other than a translational movement, for example a rotational movement or a combination of a translational movement and a rotational movement. The substrate may also be moved in a plane that is not horizontal, for example a vertical plane, or in any other orientation.

When the substrate is moved, especially translationally, it may be made to move using any mechanical conveying means, for example using belts, rollers, translational trays, air cushions. The conveying system allows the speed of the movement to be controlled and regulated. The conveying means preferably comprises a rigid chassis and a plurality of rollers. If the substrate is made of a flexible organic polymer, the movement of the substrate may be generated using a film advance system taking the form of a succession of rollers. In this case, planarity may be ensured via a suitable choice of the distance between the rollers, taking into account the thickness of the substrate, and therefore its flexibility, and any impact that the heat treatment may have on the creation of any deflection.

The laser may also be moved so as to adjust its distance relative to the substrate, which may in particular, but not only, be useful when the substrate is curved. Specifically, it is preferable, for the or each laser line, for the absolute value of the distance between the focal plane of the laser line and the substrate to be treated to be smaller than or equal to 1 mm, especially 0.5 mm, or 0.3 mm and even 0.1 mm. If the system for moving the substrate or the laser is not precise enough with respect to the distance between the focal plane and the substrate, it is preferable that the distance between the laser and the substrate can be adjusted. This adjustment may be automatic, and may especially be regulated by virtue of a distance measurement carried out upstream of the laser treatment.

The substrate and the laser sources forming the laser line may have any possible relative position, provided that the surface or volume of the substrate may be suitably irradiated. When the substrate is arranged horizontally, the or each laser source is generally arranged so as to irradiate the top face and/or the bottom face of the substrate. It is also possible to use a plurality of laser sources located on either side of the substrate, the latter being possibly positioned horizontally, vertically or at any other inclination. These laser sources may be identical or different.

The speed of the relative movement between the substrate and each laser line is advantageously at least 3 m/min, especially 4 m/min or 5 m/min and even 6 m/min or 7 m/min, or else 8 m/min and even 9 m/min or 10 m/min. In order to limit uncertainty in the position of the substrate relative to the laser line when the refractive index modulation pattern is being produced in the substrate, the speed of the relative movement between the substrate and each laser line varies, during the treatment, by at most 10 rel %, especially 2 rel % and even 1 rel % relative to its nominal value.

According to one advantageous feature, the temporal modulation of the power of the laser line is obtained by temporally modulating the input electrical signal of the one or more laser sources forming the laser line. In the context of the invention, the expression "input electrical signal of a laser source" is understood to mean either the electrical current supplied to the laser source or the electrical power supplied to the laser source.

The response time in order to obtain the temporal modulation of the power of the laser line, starting from a temporal modulation of the input electrical signal of the one or more laser sources forming the laser line, is more or less long, and depends on the turn-on and turn-off time of the or each laser source. Thus, the resolution achievable with the process according to the invention, i.e. the smallest pattern dimension capable of being obtained in the direction of the relative movement, is determined by the turn-on and turn-off time of the or each laser source, by the speed of the relative movement between the substrate and the laser line, and by the width of the laser line. The turn-on and turn-off time of a laser source is defined as the time required to pass from 10% to 90% (or vice versa) of the nominal value of the power emitted by the source, of the envelope of the power in the case of a pulsed laser source. Thus, with laser sources having a turn-on and turn-off time of about 100 µs, it is possible to obtain patterns having a dimension in the direction of the relative movement of about 50 µm. With laser sources having a turn-on and turn-off time of about 2 ms, it is possible to obtain patterns having a dimension in the direction of the relative movement of about 1 mm. With laser sources having a turn-on and turn-off time of about 20 ms, it is possible to obtain patterns having a dimension in the direction of the relative movement of about 1 cm. It is possible to limit the influence of the turn-on and turn-off times of the laser sources by modulating the power emitted by the sources without completely turning them off.

In one embodiment of the invention, a refractive index modulation pattern having a spatial periodicity is obtained by applying a temporal modulation of the input electrical signal of the laser source with a frequency equal to the ratio of the speed of the relative movement between the substrate and the laser line to the period of the pattern.

In another embodiment of the invention, a refractive index modulation pattern that does not have a spatial periodicity is obtained by varying the temporal modulation of the input electrical signal of the laser source in the course of the relative movement of the substrate and the laser line.

Advantageously, when the laser line is formed by means of a plurality of independent laser sources, the temporal modulation of the input electrical signal may be different from one laser source forming the laser line to another. It is thus possible to adjust locally the power along the laser line, thereby allowing a modulation of the refractive index also in the longitudinal direction of the laser line. This makes it possible to further increase the flexibility in the spatial modulation of the refractive index of the substrate.

According to one feature, the average power per unit area of the laser line in the focal plane is higher than or equal to $10^3$ W/cm². This power may be supplied by a laser source providing a high power per unit length, especially higher than 10 W/mm, operating in continuous-wave (CW) or quasi-continuous-wave (QCW) mode, or by a pulsed laser source of lower average power, especially lower than 100 mW/mm. In the case of a pulsed laser source, the procedure for treating the substrate is more efficient because there is no time for thermal diffusion to take place. The power of the laser line in the focal plane must be adjusted to take into account the effect of thermal diffusion. Preferably, the average power per unit area of the laser line in the focal plane is higher than or equal to $10^3$ W/cm² when it is generated using a pulsed laser source, and higher than or equal to $10^4$ W/cm² when it is generated using a laser source operating in continuous-wave or quasi-continuous-wave mode.

The temperature to which the substrate is subjected during the process is of the order of 400° C. in the case of a substrate made of mineral glass and 100° C. in the case of a substrate made of an organic polymer.

In one embodiment, the or each laser source forming the laser line is a continuous-wave or quasi-continuous-wave laser source.

In another embodiment, the or each laser source forming the laser line is a pulsed source. In this case, the power of the emitted pulses is temporally modulated. When the radiation is pulsed, the repetition frequency is advantageously at least 10 kHz, especially 15 kHz and even 20 kHz, so as to be compatible with the modulation and the movement speeds used.

In one embodiment, the laser line is kept fixed and the substrate has at least one first dimension and one second dimension, which dimensions are transverse to each other, the process comprising at least one first step and one second step such that:
  in the first step, the substrate is moved translationally parallel to its first dimension and transversely to the longitudinal direction of the laser line, and the power of the laser line is temporally modulated;
  in the second step, the substrate is moved translationally parallel to its second dimension and transversely to the longitudinal direction of the laser line, and the power of the laser line is temporally modulated.

In this embodiment, the substrate is subjected to at least two treatments steps in succession, a first step in one direction and a second step in a direction transverse to the direction of the first treatment step. Thus, the process according to the invention allows the refractive index of the substrate to be given a grid structure, the grid being created with at least two grid directions.

Another subject of the invention is an apparatus for treating a transparent substrate in order to provide it with modulated optical properties, by creating a refractive index modulation pattern in the substrate, this apparatus comprising:
  one or more laser sources and shaping and redirecting optics able to generate at least one laser line;
  moving means able to, in operation, generate a relative movement between the substrate and the laser line in a direction transverse to the longitudinal direction of the laser line, while the laser line is focused on the substrate;
  means for temporally modulating the power of the laser line as a function of the speed of the relative movement and as a function of the dimensions of the pattern in the direction of the relative movement.

Another subject of the invention is a transparent substrate having modulated optical properties, made of untempered mineral glass or of organic polymer, capable of being obtained by the process described above, comprising a refractive index modulation pattern made up of a series of juxtaposed lines or line portions, where the value of the refractive index of the substrate changes from one line to another and a characteristic dimension of the change in value of the refractive index of the substrate, measured transversely to the longitudinal direction of the lines, is a multiple of a nominal dimension comprised between 10 µm and 1000 µm, preferably between 10 µm and 200 µm.

According to one feature, the substrate, or the portion of the substrate which actually has the refractive index modulation pattern, has at least one dimension larger than or equal to 0.5 m, especially 1 m or 2 m or even 3 m. Preferably, the surface area of the main faces of the substrate, or of the portion of the substrate which actually has the refractive index modulation pattern, is greater than or equal to 1 m², more preferably greater than or equal to 1.4 m². In an advantageous embodiment, the treated substrate is a parallelepiped having a length of 1.3 m and a width of 1.1 m. An advantage of the invention is that a refractive index modulation pattern can be obtained rapidly, even for large sizes of substrates, with a high level of resolution.

In one embodiment, the value of the refractive index of the substrate continuously changes from one line to another. Then, the refractive index modulation pattern of the substrate is a pattern with a continuous variation of the refractive index perpendicularly to the longitudinal direction of the juxtaposed lines or line portions of the pattern. Such a continuous variation in the refractive index can be obtained, for example, by temporally modulating the power of the laser line according to a signal function of the sinusoidal or triangular type.

According to the invention, the refractive index modulation pattern may be present only on the surface of the substrate, on one or more of its surfaces, or present in the volume of the substrate.

Features and advantages of the invention will become apparent from the following description of a number of example embodiments of a process and substrate according to the invention, this description being given merely by way of example and with reference to the appended drawings in which.

Figure 3:
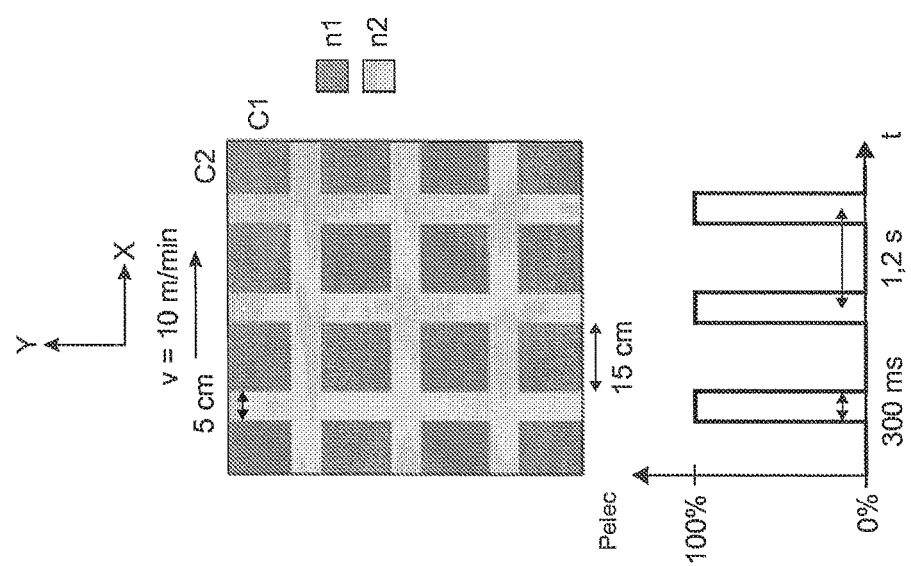

FIG. 3 is a top view of a substrate having modulated optical properties according to a third embodiment of the invention, the substrate being obtained by the process of the invention comprising two treatment steps in succession in two directions that are perpendicular to each other, so as to create a grid, the lower portion of FIG. 3 showing the square-wave type electrical power applied as input to the laser sources in each treatment step (Example 4).

Figure 4:
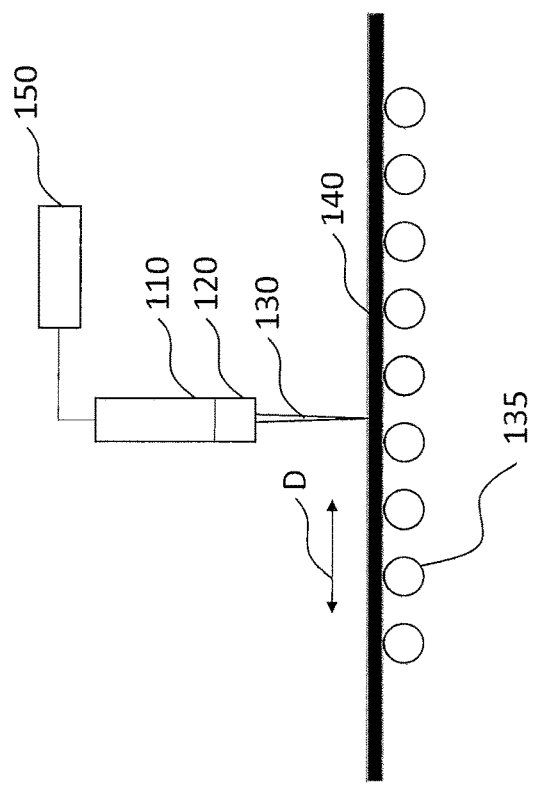

FIG. 4 is a schematic view of an apparatus for treating a transparent substrate according to an embodiment of the invention.

EXAMPLE 1

The process according to the invention is applied to a substrate made of clear soda-lime-silica glass, sold under the name SGG PLANILUX by Saint-Gobain Glass, which is obtained by the float process then cut into a rectangular shape having a length L=6 m and a width λ=3.3 m.

The laser line used to carry out the process is formed by laser sources which are InGaAs laser diodes, which are quasi-continuous-wave sources emitting at a wavelength comprised between 900 nm and 1000 nm. The laser line is 3.3 m in length, i.e. of length equal to the width λ of the substrate, and has an average width of 50 µm. The width of the laser line is uniform all the way along the line, so that the difference between the largest width and the smallest width is 3% of the average value, i.e. 1.5 µm.

The substrate is placed on a roller conveyor so as to be run in a direction X parallel to its length. The laser line is kept fixed and positioned above the top face of the substrate with its longitudinal direction Y extending perpendicularly to the run direction X of the substrate, i.e. across the width of the substrate, extending across the entire width of the substrate.

The position of the focal plane of the laser line is adjusted in order to be at the center of the thickness of the substrate when the latter is positioned on the conveyor, the average power per unit area of the laser line in the focal plane being $10^5$ W/cm$^2$.

The substrate is made to run under the laser line at a speed of 10 m/min, this speed varying by no more than 1 rel %. In the course of the movement of the substrate under the laser line, square-wave type electrical power $P_{elec}$ is applied as input to the laser diodes, as may be seen at the bottom of FIG. 1, which shows the variation of $P_{elec}$ as a function of time t. The period of the square-wave signal $P_{elec}(t)$ is 1.2 s and the pulse length is 300 ms.

Figure 1:
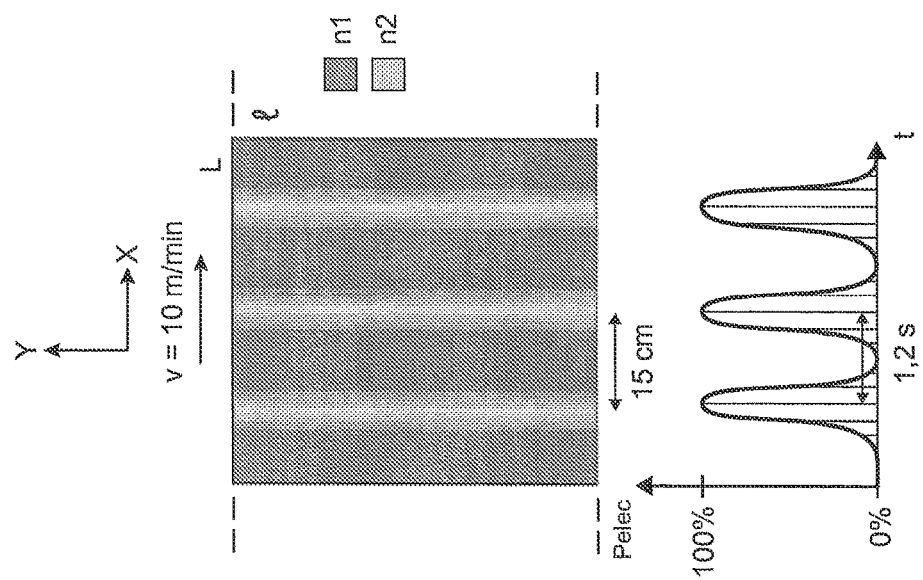
FIG. 1 is a top view of a substrate having modulated optical properties according to a first embodiment of the invention, the substrate being obtained by the process of the invention, the lower portion of FIG. 1 showing the square-wave type electrical power applied as input to the laser sources (Examples 1 and 2)

As shown in FIG. 1, a substrate comprising a refractive index modulation pattern is thus obtained, in which treated strips of width equal to 5 cm lying parallel to the length of the substrate are alternated with untreated strips of width equal to 15 cm lying parallel to the length of the substrate. The treated strips have a refractive index n2 increased by about 0.01 relative to the refractive index n1 of the untreated strips.

EXAMPLE 2

As in Example 1, the process according to the invention is applied to a substrate made of clear soda-lime-silica glass, sold under the name SGG PLANILUX by Saint-Gobain Glass, which is obtained by the float process then cut into a rectangular shape having a length L=6 m and a width λ=3.3 m.

For Example 2, the laser line used to carry out the process is formed by laser sources which are disc laser Yb:YAG coupled into an optical fiber of 300 µm core diameter, emitting at a wavelength of 1030 nm. The laser line is 3.3 m in length, i.e. of length equal to the width λ of the substrate, and has an average width of 50 µm. The width of the laser line is uniform all the way along the line, so that the difference between the largest width and the smallest width is 3% of the average value, i.e. 1.5 µm.

The substrate is placed on a roller conveyor so as to be run in a direction X parallel to its length. The laser line is kept fixed and positioned above the top face of the substrate with its longitudinal direction Y extending perpendicularly to the run direction X of the substrate, i.e. across the width of the substrate, extending across the entire width of the substrate.

The position of the focal plane of the laser line is adjusted in order to be at the center of the thickness of the substrate when the latter is positioned on the conveyor, the average power per unit area of the laser line in the focal plane being $10^5$ W/cm$^2$.

The substrate is made to run under the laser line at a speed of 10 m/min, this speed varying by no more than 1 rel %. In the course of the movement of the substrate under the laser line, a control voltage of the power $P_{elec}$ of the square-wave type is applied as input to the laser sources, as may be seen at the bottom of FIG. 1, which shows the variation of $P_{elec}$ as a function of time t. As in Example 1, the period of the square-wave signal $P_{elec}(t)$ is 1.2 s and the pulse length is 300 ms.

A substrate comprising a refractive index modulation pattern as shown in FIG. 1 is thus obtained, in which treated strips of width equal to 5 cm lying parallel to the length of the substrate are alternated with untreated strips of width equal to 15 cm lying parallel to the length of the substrate.

The treated strips have a refractive index n2 increased by about 0.01 relative to the refractive index n1 of the untreated strips.

EXAMPLE 3

As in Examples 1 and 2, the process according to the invention is applied to a substrate made of clear soda-lime-silica glass, sold under the name SGG PLANILUX by Saint-Gobain Glass, which is obtained by the float process then cut into a rectangular shape having a length L=6 m and a width λ=3.3 m.

For Example 3, the laser line used to carry out the process is formed by pulsed laser sources, pulsed with a pulse length of 400 fs and a repetition rate of 500 kHz and emitting at a wavelength of 1040 nm. The laser line is 3.3 m in length, i.e. of length equal to the width λ of the substrate, and has an average width of 50 µm. The width of the laser line is uniform all the way along the line, so that the difference between the largest width and the smallest width is 3% of the average value, i.e. 1.5 µm.

The substrate is placed on a roller conveyor so as to be run in a direction X parallel to its length. The laser line is kept fixed and positioned above the top face of the substrate with its longitudinal direction Y extending perpendicularly to the run direction X of the substrate, i.e. across the width of the substrate, extending across the entire width of the substrate.

The position of the focal plane of the laser line is adjusted in order to be at the center of the thickness of the substrate when the latter is positioned on the conveyor, the average power per unit area of the laser line in the focal plane being $10^3$ W/cm².

The substrate is made to run under the laser line at a speed of 10 m/min, this speed varying by no more than 1 rel %. In the course of the movement of the substrate under the laser line, sinusoidal-wave electrical power $P_{elec}$ is applied as input to the laser diodes, as may be seen at the bottom of FIG. 2, which shows the variation of $P_{elec}$ as a function of time t. The period of the sinusoidal signal $P_{elec}(t)$ is 1.2 s, thereby allowing the power of the pulses of the laser sources to be temporally modulated as schematically shown in FIG. 2, in which only a few pulses have been shown in the envelope of the sinusoidal signal.

Figure 2:
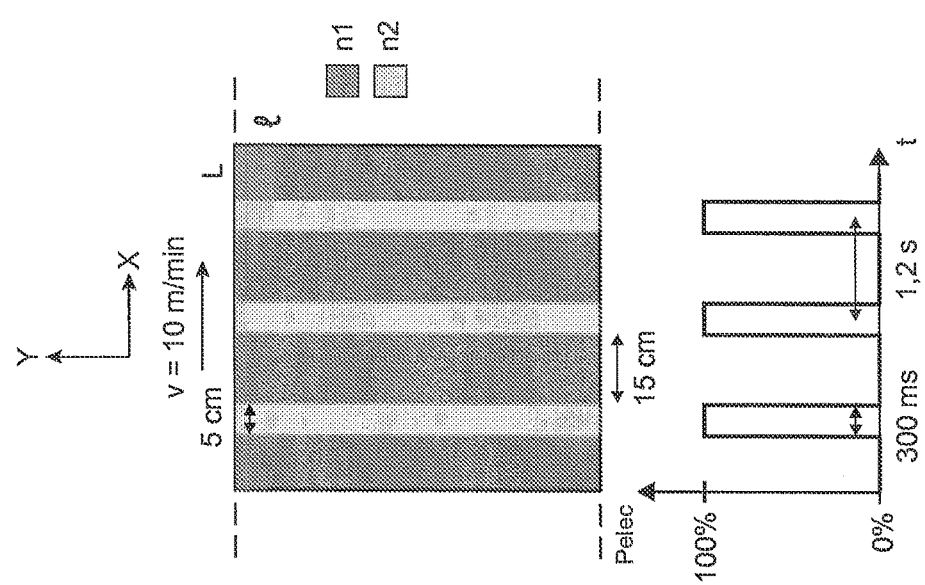
FIG. 2 is a top view of a substrate having modulated optical properties according to a second embodiment of the invention, the substrate being obtained by the process of the invention, the lower portion of FIG. 2 showing the sinusoidal-wave type electrical power applied as input to the laser sources (Example 3)

As FIG. 2 shows, a substrate comprising a refractive index modulation pattern having a spatial periodicity of 15 cm is thus obtained, with an alternately increasing and decreasing refractive index gradient in the length direction of the substrate. The higher-index zones have a refractive index n2 increased by about 0.01 relative to the refractive index n1 of the lower-index zones, where the refractive index n1 corresponds to the refractive index of the untreated substrate.

EXAMPLE 4

As above, the process according to the invention is applied to a substrate made of clear soda-lime-silica glass, sold under the name SGG PLANILUX by Saint-Gobain Glass, which is obtained by the float process then cut this time into a square shape of 3.3 m side length.

In this embodiment, the process comprises, in succession, two steps of treating the substrate, the first step being identical to the treatment applied to the substrate in the first embodiment, the substrate running parallel to one of its sides C1, and the second step also being identical to the treatment applied to the substrate in the first embodiment, but the substrate this time running parallel to another of its sides C2, perpendicular to the side C1. This second step is illustrated in FIG. 3.

As FIG. 3 shows, a substrate comprising a refractive index modulation pattern taking the form of a grid is thus obtained, the lines of the grid being treated strips of width equal to 5 cm that bound between them square untreated zones having a side length of 15 cm. The treated strips have a refractive index n2 increased by about 0.01 relative to the refractive index n1 of the square untreated zones.

FIG. 4 is a schematic view of an apparatus for treating a transparent substrate according to an embodiment of the invention. The apparatus includes one or more laser sources 110 and shaping and redirecting optics 120 able to generate at least one laser line 130. The apparatus also includes moving elements 135 able to, in operation, generate a relative movement D between the transparent substrate 140 and the laser line 130. The apparatus further includes a unit 150 for temporally modulating a power of the laser line as a function of a speed of the relative movement and as a function of dimensions of the pattern in the direction of the relative movement.

The invention claimed is:

1. A process for obtaining a transparent substrate having modulated optical properties, comprising a refractive index modulation pattern, the process comprising irradiating a transparent substrate with a laser radiation focused on the transparent substrate in the form of at least one laser line, where the transparent substrate at least partially absorbs the laser radiation, and generating a relative movement between the transparent substrate and the laser line focused on the transparent substrate, in a direction transverse to a longitudinal direction of the laser line, wherein, in the course of the relative movement, a power of the laser line is temporally modulated as a function of a speed of the relative movement and as a function of dimensions of the pattern in the direction of the relative movement.

2. The process according to claim 1, wherein the laser line is focused on a surface of the transparent substrate.

3. The process according to claim 1, wherein the laser line is focused in a volume of the transparent substrate.

4. The process according to claim 1, wherein the longitudinal direction of the laser line is substantially perpendicular to the direction of the relative movement.

5. The process according to claim 1, wherein the laser line is kept fixed and the transparent substrate is moved translationally in a direction transverse to the longitudinal direction of the laser line.

6. The process according to claim 1, wherein the power of the laser line is temporally modulated by temporally modulating an input electrical signal of the or each laser source forming the laser line.

7. The process according to claim 6, wherein the refractive index modulation pattern has a spatial periodicity and a frequency of the temporal modulation of the input electrical signal of the laser source is equal to a ratio of the speed of the relative movement between the transparent substrate and the laser line to the period of the pattern.

8. The process according to claim 6, wherein the temporal modulation of the input electrical signal of the laser source varies in the course of the relative movement of the transparent substrate and laser line.

9. The process according to claim 6, wherein the laser line is formed by means of a plurality of independent laser sources, the temporal modulation of the input electrical signal being different from one laser source forming the laser line to another.

10. The process according to claim 1, wherein the laser line has an average width comprised between 10 μm and 1000 μm.

11. The process according to claim 10, wherein the laser line has an average width comprised between 30 μm and 200 μm.

12. The process according to claim 1, wherein the or each laser source forming the laser line is a continuous-wave laser source or a quasi-continuous-wave laser source.

13. The process according to claim 1, wherein the or each laser source forming the laser line is a pulsed source and the power of the emitted pulses is temporally modulated.

14. The process according to claim 1, wherein a wavelength of the radiation of the or each laser line is comprised in a range extending from 100 nm to 2000 nm or in a range extending from 5 μm to 15 μm.

15. The process according to claim 1, wherein the laser line is kept fixed and the transparent substrate has at least one first dimension and one second dimension, which dimensions are transverse to each other, the process comprising at least one first step and one second step such that:
   in the first step, the transparent substrate is moved translationally parallel to the first dimension and transversely to the longitudinal direction of the laser line, and the power of the laser line is temporally modulated;
   in the second step, the transparent substrate is moved translationally parallel to the second dimension and transversely to the longitudinal direction of the laser line, and the power of the laser line is temporally modulated.

16. The process according to claim 1, wherein the transparent substrate has at least one dimension larger than 1 m.

17. The process according to claim 16, wherein the at least one dimension is larger than 3 m.

18. The process according to claim 1, wherein an average power per unit area of the laser line in the focal plane is higher than or equal to $10^3$ W/cm$^2$.

19. The process according to claim 1, wherein the speed of the relative movement is at least 3 meters per minute.

20. An apparatus for treating a transparent substrate in order to provide the transparent substrate with modulated optical properties, by creating a refractive index modulation pattern in the transparent substrate, the apparatus comprising:
   one or more laser sources and shaping and redirecting optics able to generate at least one laser line;
   moving elements able to, in operation, generate a relative movement between the transparent substrate and the laser line in a direction transverse to a longitudinal direction of the laser line, while the laser line is focused on the transparent substrate;
   a modulator to modulate electrical current supplied to the one or more laser sources or to modulate electrical power supplied to the one or more laser sources so as to temporally modulate a power of the laser line as a function of a speed of the relative movement and as a function of dimensions of the pattern in the direction of the relative movement.

* * * * *